(12) United States Patent
Kanaya

(10) Patent No.: US 10,937,986 B2
(45) Date of Patent: Mar. 2, 2021

(54) DISPLAY DEVICE

(71) Applicant: Japan Display Inc., Minato-ku (JP)

(72) Inventor: Heisuke Kanaya, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/601,806

(22) Filed: Oct. 15, 2019

(65) Prior Publication Data

US 2020/0127224 A1 Apr. 23, 2020

(30) Foreign Application Priority Data

Oct. 23, 2018 (JP) .............................. JP2018-198906

(51) Int. Cl.
| | |
|---|---|
| G06F 3/041 | (2006.01) |
| H01L 51/52 | (2006.01) |
| H01L 27/32 | (2006.01) |
| G06F 3/044 | (2006.01) |

(52) U.S. Cl.
CPC .......... H01L 51/5206 (2013.01); G06F 3/044 (2013.01); H01L 27/323 (2013.01); H01L 27/3211 (2013.01); H01L 27/3246 (2013.01); H01L 27/3248 (2013.01); H01L 27/3276 (2013.01); H01L 51/5221 (2013.01)

(58) Field of Classification Search
CPC ...... G06F 3/0412; G06F 3/044; G06F 3/0443; G06F 3/041662
See application file for complete search history.

(56) References Cited

U.S. PATENT DOCUMENTS

| | | | |
|---|---|---|---|
| 2016/0118449 A1 | 4/2016 | Sato et al. | |
| 2016/0155785 A1 | 6/2016 | Sato | |
| 2017/0192556 A1* | 7/2017 | Deng | G06F 3/0412 |
| 2018/0364847 A1* | 12/2018 | Xiong | H01L 27/323 |
| 2019/0181206 A1* | 6/2019 | Cao | H01L 51/5092 |
| 2020/0110479 A1* | 4/2020 | Liu | G02F 1/1333 |
| 2020/0303467 A1* | 9/2020 | Feng | H01L 27/323 |

FOREIGN PATENT DOCUMENTS

| | | |
|---|---|---|
| JP | 2016-85913 A | 5/2016 |
| JP | 2016-103395 A | 6/2016 |

* cited by examiner

*Primary Examiner* — Dennis P Joseph
(74) *Attorney, Agent, or Firm* — Oblon, McClelland, Maier & Neustadt, L.L.P.

(57) ABSTRACT

A display device includes an electroluminescent layer laminated on pixel electrodes and a multifunctional electrode and a common electrode laminated on the electroluminescent layer. The electroluminescent layer includes a lower common layer that continuously overlaps and contacts the pixel electrodes and the multifunctional electrode and light emitting layers separated from each other corresponding to each of the pixel electrodes on the lower common layer. The multifunctional electrode includes portions each passing between a pair of adjacent pixel electrodes of the pixel electrodes, and is set to a potential closer to that of the common electrode than the pixel electrodes in an image display period, and at least a part of the multifunctional electrode functions as at least one electrode group of a transmission electrode group and a reception electrode group in a touch sensing period.

15 Claims, 11 Drawing Sheets

DISPLAY DEVICE

CROSS-REFERENCE TO RELATED APPLICATION

The present application claims priority from Japanese patent application JP2018-198906 filed on Oct. 23, 2018, the content of which is hereby incorporated by reference into this application.

BACKGROUND OF THE INVENTION

1. Field of the Invention

The present invention relates to a display device.

2. Description of the Related Art

In recent years, in a display device, adjacent pixels have come closer to each other as the number of pixels increases. There is an organic electroluminescent display having a layer (for example, a carrier injection and transport layer) that is continuous to all pixels even if a light emitting layer is separated for each pixel, and in the organic electroluminescent display, an adjacent pixel may emit light due to a leakage current transmitted through the continuous layer (JP 2016-103395 A and JP 2016-85913 A).

When a full-color pixel is driven with a low current and displayed in a single color, a sub-pixel not receiving a signal also emits light due to the leakage current, and chromaticity changes. This is a factor that makes gamma (γ) correction difficult. Although an electrode for releasing a current is disclosed in JP 2016-85913A, effective utilization of the electrode is required.

SUMMARY OF THE INVENTION

An object of the present invention is to effectively utilize a structure that prevents occurrence of a leakage current to an adjacent pixel.

A display device according to the present invention includes a plurality of pixel electrodes, a multifunctional electrode, an electroluminescent layer laminated on the plurality of pixel electrodes and the multifunctional electrode, and a common electrode laminated on the electroluminescent layer, and in which the electroluminescent layer includes a lower common layer that continuously overlaps and contacts the plurality of pixel electrodes and the multifunctional electrode and a plurality of light emitting layers separated from each other corresponding to each of the plurality of pixel electrodes on the lower common layer, the multifunctional electrode includes a plurality of portions each passing between a pair of adjacent pixel electrodes of the plurality of pixel electrodes, and is set to a potential closer to that of the common electrode than the plurality of pixel electrodes in an image display period, and at least a part of the multifunctional electrode functions as at least one electrode group of a transmission electrode group and a reception electrode group in a touch sensing period.

According to the present invention, at least the part of the multifunctional electrode functions as at least one electrode group of the transmission electrode group and the reception electrode group in the touch sensing period. Also, since the multifunctional electrode is set to a potential closer to that of the common electrode than the plurality of pixel electrodes in the image display period, the leakage current to the adjacent pixel can be released and is effectively used.

DETAILED DESCRIPTION OF THE INVENTION

Hereinafter, embodiments of the present invention will be described with reference to the drawings. However, the present invention can be implemented in various modes without departing from the gist of the present invention, and the present invention is not interpreted as being limited to contents of the description of the embodiments exemplified below.

Although the drawings may be schematically represented with respect to the width, thickness, shape, and the like of each part in comparison with an actual mode in order to clarify explanation, the drawings are merely examples and do not limit interpretation of the present invention. In the present specification and each drawing, elements having the same functions as those described with reference to the previous drawings may be denoted by the same reference numerals, and redundant descriptions thereof may be omitted.

Furthermore, in the detailed description of the present invention, when defining a positional relationship between a certain constituent element and other constituent element, the terms "above" and "below" are not only when the other constituent element is directly above or below the certain constituent element, but unless otherwise specified, a case where another constituent element is further interposed the constituent elements is included.

First Embodiment

Figure 1:
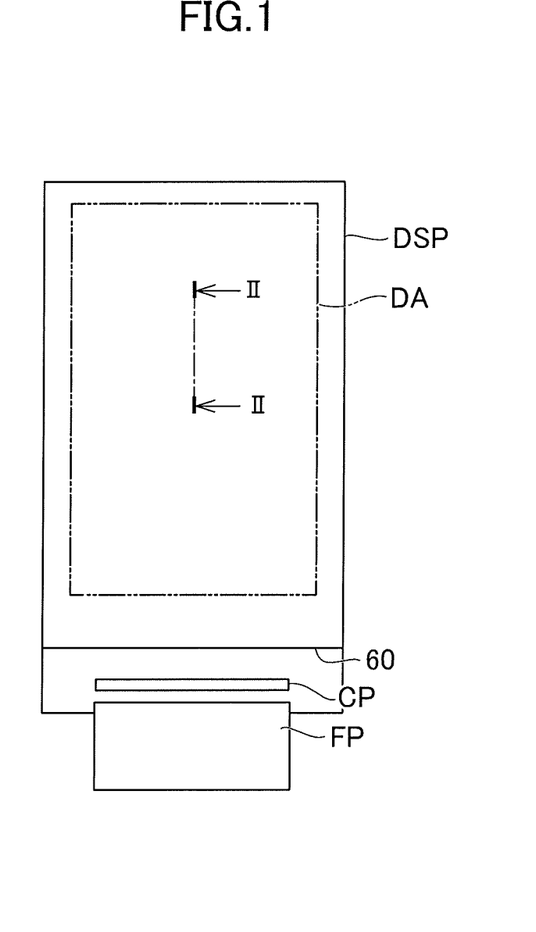
FIG. 1 is a plan view of a display device according to a first embodiment of the present invention.

FIG. 1 is a plan view of a display device according to a first embodiment of the present invention. The display device includes a display DSP. The display DSP is flexible and adapted to be bent outside a display area DA. On the display DSP, an integrated circuit chip CP for driving an element for displaying an image is mounted. A flexible printed circuit FP is connected to the display DSP.

The display device is, for example, an organic electroluminescent display device. The display device has the display area DA in which an image is displayed. In the display area DA, for example, a full-color pixel is formed by combining unit pixels (sub-pixels) of plural colors of red, green, and blue, and a full-color image is displayed.

Figure 2:
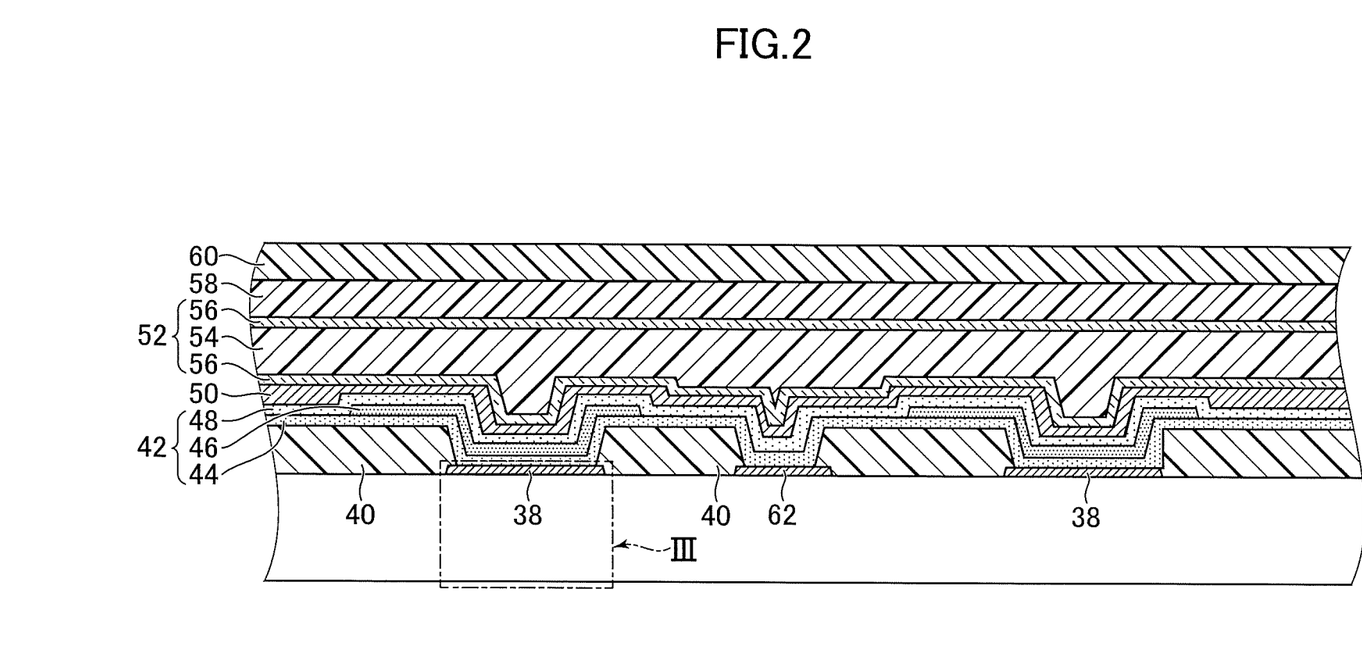
FIG. 2 is a cross-sectional view taken along line II-II of the display device illustrated in FIG. 1.
Figure 3:
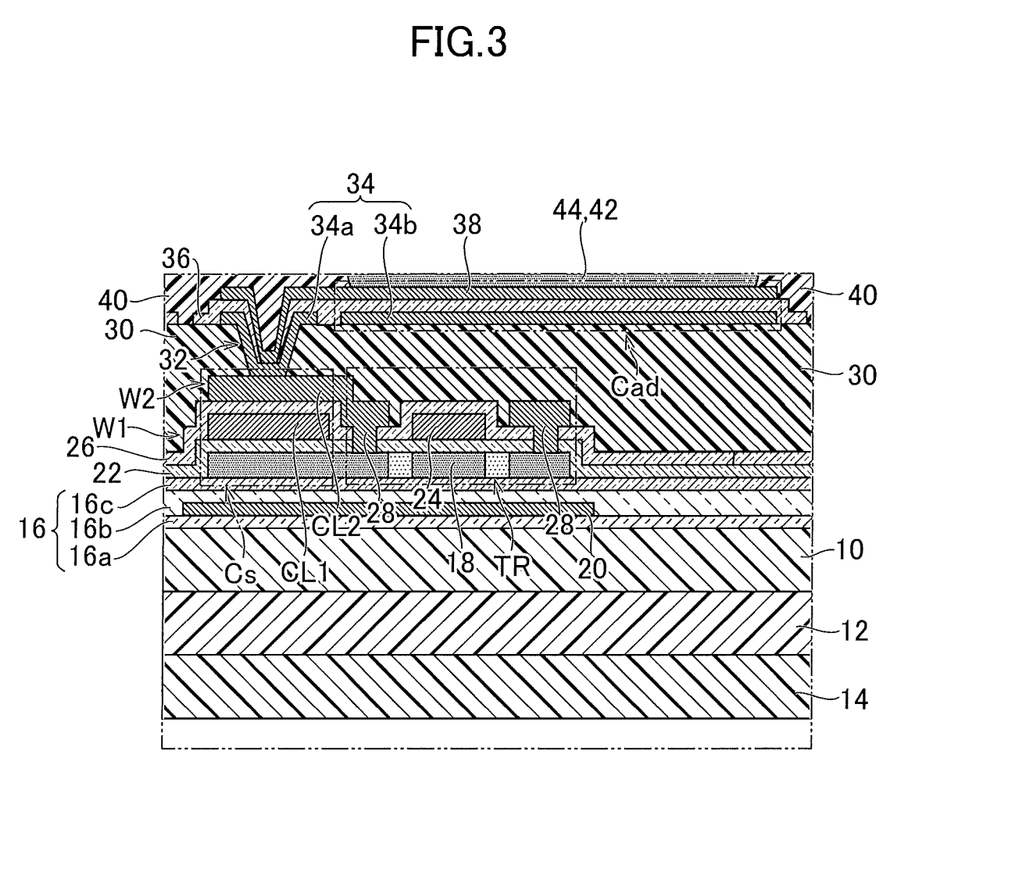
FIG. 3 is an enlarged view of a portion III illustrated in FIG. 2.

FIG. 2 is a cross-sectional view taken along line II-II of the display device illustrated in FIG. 1. FIG. 3 is an enlarged view of a portion III illustrated in FIG. 2. A resin substrate 10 illustrated in FIG. 3 is made of polyimide. However, other resin materials may be used as long as a base material has sufficient flexibility to constitute a sheet display or a flexible display. A reinforcing film 14 is attached to a back surface of the resin substrate 10 via a pressure sensitive adhesive 12.

An inorganic barrier film 16 (undercoat layer) is laminated on the resin substrate 10. The inorganic barrier film 16 has a three-layer laminated structure of a silicon oxide film 16a, a silicon nitride film 16b, and a silicon oxide film 16c. Although the silicon oxide film 16a as the lowermost layer is provided for improving adhesion with the resin substrate 10, the silicon nitride film 16b as a middle layer is provided as a block film of moisture and impurities from the outside, and the silicon oxide film 16c as the uppermost layer is provided as a block film so that hydrogen atoms contained in the silicon nitride film 16b are not diffused to the semiconductor layer 18 side of a thin film transistor TR, the structure of the inorganic barrier film 16 is not particularly limited to this structure, and may have a structure in which an addition layer is further laminated or which is a single-layer structure or a two-layer structure.

An additional film 20 may be formed in accordance with a place where the thin film transistor TR is to be formed. The additional film 20 suppresses change in characteristics of the thin film transistor TR due to intrusion of light from the back surface of a channel, or is made of a conductive material and is given a predetermined potential, thereby capable of giving a back gate effect to the thin film transistor TR. Here, the inorganic barrier film 16 is formed in such a way that the additional film 20 is formed in an island shape in accordance with a place where the thin film transistor TR is formed after the silicon oxide film 16a is formed and then the silicon nitride film 16b and the silicon oxide film 16c are laminated so as to enclose the additional film 20 in the inorganic barrier film 16, but is not limited thereto. The inorganic barrier film 16 may be formed after the additional film 20 is formed on the resin substrate 10 first.

The thin film transistor TR is formed on the inorganic barrier film 16. Although only an Nch transistor is illustrated here by taking a polysilicon thin film transistor as an example, a Pch transistor may be formed simultaneously. A semiconductor layer 18 of the thin film transistor TR adopts a structure in which a low concentration impurity region is provided between a channel region and source and drain regions. Here, a silicon oxide film is used as a gate insulating film 22. A gate electrode 24 is a part of a first wiring layer W1 made of MoW. The first wiring layer W1 includes a first holding capacitor line CL1 in addition to the gate electrode 24. A part of a holding capacitor Cs is formed between the first holding capacitor line CL1 and the semiconductor layer 18 (source and drain regions) via the gate insulating film 22.

An interlayer insulating film 26 (silicon oxide film and silicon nitride film) is laminated on the gate electrode 24. A second wiring layer W2 including a portion to be a source and drain electrode 28 is formed on the interlayer insulating film 26. Here, a three-layer laminated structure of Ti, Al, and Ti is adopted. Another part of the holding capacitor Cs is formed by the first holding capacitor line CL1 (part of the first wiring layer W1) and a second holding capacitor line CL2 (part of the second wiring layer W2) via the interlayer insulating film 26.

An organic flattening film 30 is provided to cover the source and drain electrode 28. Since the organic flattening film 30 is excellent in surface flatness compared to an inorganic insulating material formed by chemical vapor deposition (CVD) or the like, resin such as photosensitive acrylic is used.

The organic flattening film 30 is removed at a pixel contact portion 32, and an indium tin oxide (ITO) film 34 is formed thereon. The indium tin oxide film 34 includes a first transparent conductive film 34a and a second transparent conductive film 34b separated from each other.

The second wiring layer W2 whose surface is exposed by removing the organic flattening film 30 is covered with the first transparent conductive film 34a. A silicon nitride film 36 is provided on the organic flattening film 30 so as to cover the first transparent conductive film 34a. The silicon nitride film 36 has an opening in the pixel contact portion 32, and a pixel electrode 38 is laminated thereon so as to be conductive to the source and drain electrode 28 via the opening. Each pixel electrode 38 is formed as a reflective electrode and has a three-layer laminated structure of an indium zinc oxide film, an Ag film, and an indium zinc oxide film. Here, an indium tin oxide film may be used instead of the indium zinc oxide film. The pixel electrode 38 extends laterally from the pixel contact portion 32 and reaches above the thin film transistor TR.

The second transparent conductive film 34b is provided adjacent to the pixel contact portion 32 and below the pixel electrodes 38 (and further below the silicon nitride film 36). The second transparent conductive film 34b, the silicon nitride film 36, and the pixel electrode 38 overlap, and an additional capacitor Cad is formed by these components.

On the organic flattening film 30, for example, above the pixel contact portion 32, an organic insulating film 40, which is called a bank (rib) and serves as a partition wall of adjacent pixel regions, is formed. As the organic insulating film 40, photosensitive acrylic or the like is used similarly as in the organic flattening film 30. The organic insulating film 40 is preferably opened so as to expose the surface of the pixel electrode 38 as a light emitting region, and an opening end thereof preferably has a gentle tapered shape. When the opening end has a steep shape, a coverage failure of an electroluminescent layer 42 formed thereon is caused.

As illustrated in FIG. 3, the organic flattening film 30 and the organic insulating film 40 are in contact with each other through an opening provided in the silicon nitride film 36 between the films 30 and 40. With this configuration, moisture and degassing desorbed from the organic flattening film 30 can be extracted through the organic insulating film 40, by heat treatment or the like after formation of the organic insulating film 40.

As illustrated in FIG. 2, the electroluminescent layer 42 made of, for example, an organic material is laminated on the plurality of pixel electrodes 38. The electroluminescent layer 42 includes a lower common layer 44. The lower common layer 44 continuously overlaps and contacts the plurality of pixel electrodes 38. The lower common layer 44 is, for example, a laminated layer of a hole transport layer or a hole injection layer and a hole transport layer. The lower common layer 44 may be formed by vapor deposition or may be formed by coating on solvent dispersion, and is solidly formed on the entire surface covering the display area DA.

The electroluminescent layer 42 includes a plurality of light emitting layers 46. The plurality of light emitting layers 46 are on the lower common layer 44. The plurality of light emitting layers 46 are separated from one another corresponding to the plurality of pixel electrodes 38, respectively. The light emitting layer 46 is selectively formed with respect to the pixel electrode 38 (sub-pixel).

The electroluminescent layer 42 includes an upper common layer 48. The upper common layer 48 continuously overlaps and contacts the plurality of light emitting layers 46, and overlaps and contacts the lower common layer 44 outside the light emitting layer 46. The upper common layer 48 is, for example, a laminated layer of an electron transport layer or an electron injection layer and an electron transport layer. The upper common layer 48 may be formed by vapor deposition, or may be formed by coating on solvent dispersion, and is solidly formed on the entire surface covering the display area DA.

A common electrode 50 is laminated on the electroluminescent layer 42. Here, since a top emission structure is adopted, the common electrode 50 is transparent. For example, an Mg layer and an Ag layer are formed as thin films that allow light emitted from the electroluminescent layer 42 to pass therethrough. In the first embodiment, the pixel electrode 38 is an anode, and the common electrode 50 is a cathode. The plurality of pixel electrodes 38, the common electrode 50, and the electroluminescent layer 42 interposed between central portions of the plurality of pixel electrodes 38 and the common electrode 50 constitute a light emitting element OD (FIG. 4).

A sealing layer 52 is formed on the common electrode 50. The sealing layer 52 has a function of preventing moisture from entering the electroluminescent layer 42 from the outside, and is required to have a high gas barrier property. The sealing layer 52 has a laminated structure of an organic film 54 and a pair of inorganic films 56 (for example, silicon nitride films) sandwiching the organic film 54 from above and below. The pair of inorganic films 56 contact and overlap each other around the organic film 54. A protective layer 58 and a polarizing plate 60 (for example, a circularly polarizing plate) are laminated on the sealing layer 52.

Figure 4:
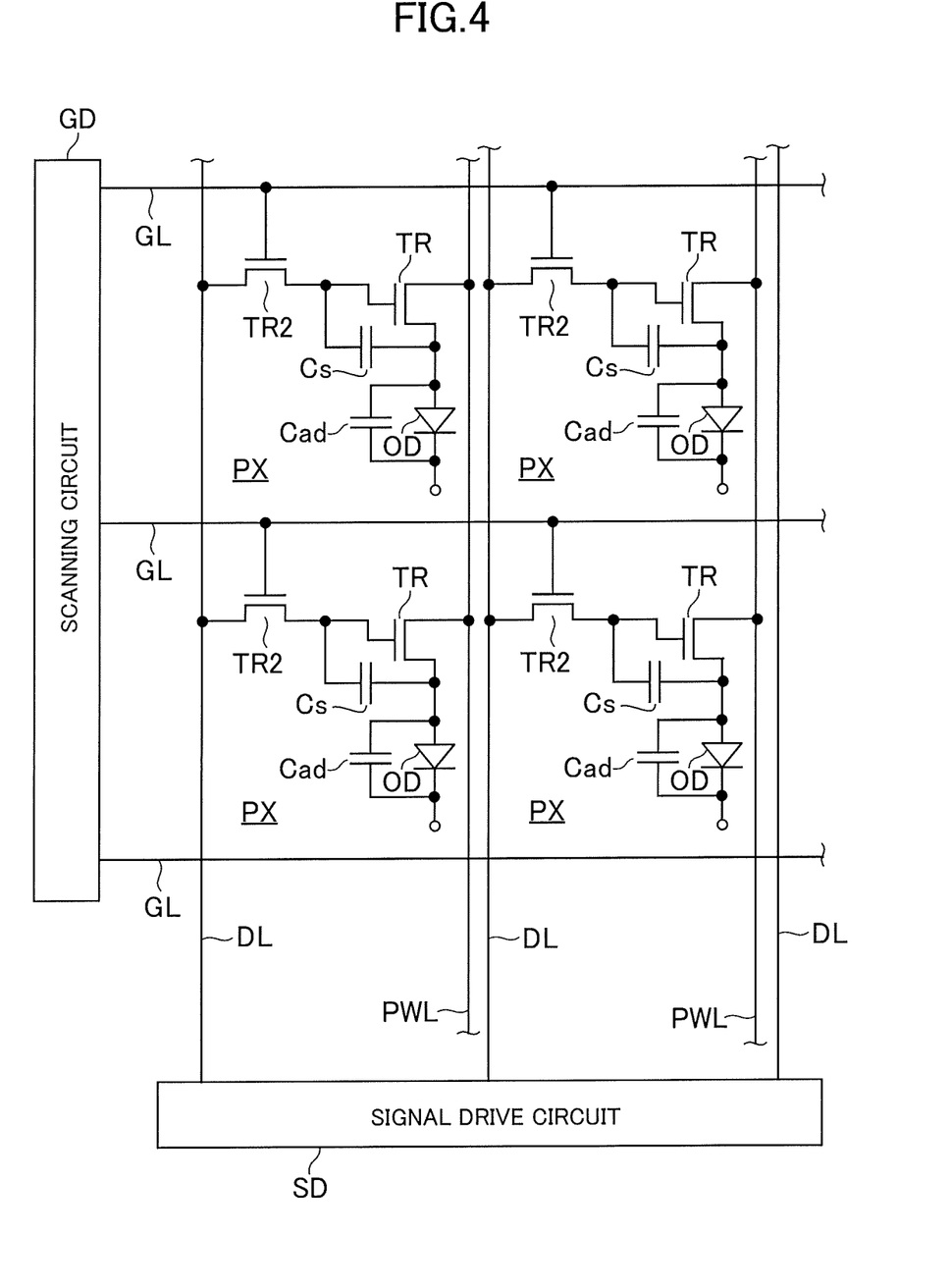
FIG. 4 is a circuit diagram of the display device illustrated in FIG. 1.

FIG. 4 is a circuit diagram of the display device illustrated in FIG. 1. The circuit includes a plurality of scanning lines GL connected to a scanning circuit GD and a plurality of signal lines DL connected to a signal drive circuit SD. The signal drive circuit SD is disposed in the integrated circuit chip CP illustrated in FIG. 1. An area surrounded by two adjacent scanning lines GL and two adjacent signal lines DL is one pixel PX. The pixel PX includes the thin film transistor TR as a drive transistor, a thin film transistor TR2 as a switch, and the holding capacitor Cs. By applying a gate voltage to the scanning line GL, the thin film transistor TR2 is turned ON, a video signal is supplied from the signal line DL, and charges are stored in the holding capacitor Cs. By storing the charge in the holding capacitor Cs, the thin film transistor TR is turned on, and a current flows from a power supply line PWL to the light emitting element OD. The light emitting element OD emits light by this current.

The color of light generated in the light emitting layer 46 is any of a plurality of colors (for example, red, green, and blue) for forming the full-color pixel. That is, the full-color pixel is composed of sub-pixels of a plurality of colors, and the light emitting layer 46 corresponding to the sub-pixel emits light of any of the plurality of colors.

As illustrated in FIG. 2, the display device has a multifunctional electrode 62. The multifunctional electrode 62 is in the same layer as the plurality of pixel electrodes 38. The electroluminescent layer 42 is laminated on the multifunctional electrode 62. Specifically, the lower common layer 44 continuously overlaps and contacts the multifunctional electrode 62.

Figure 5:
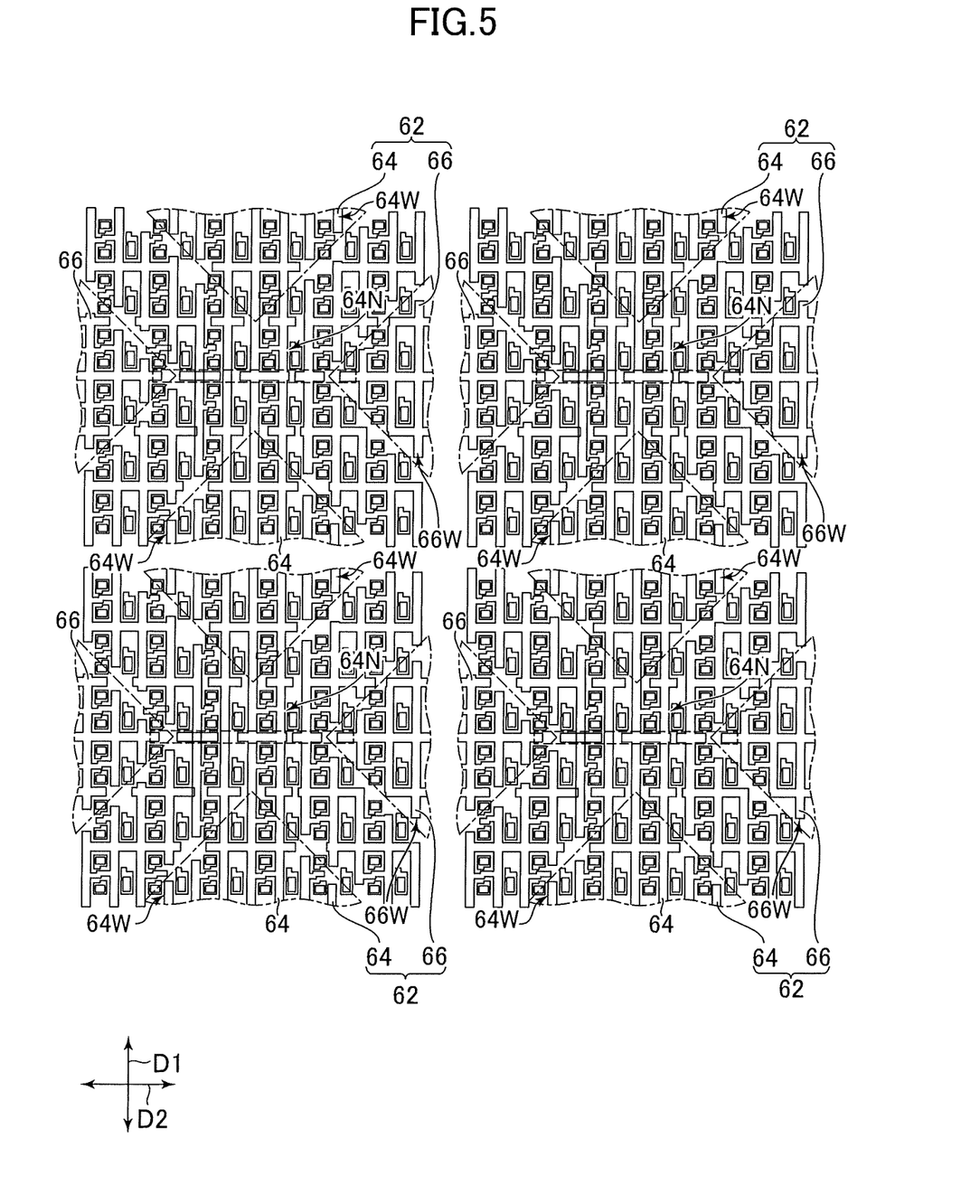
FIG. 5 is a plan view of a part of a display area.
Figure 6:
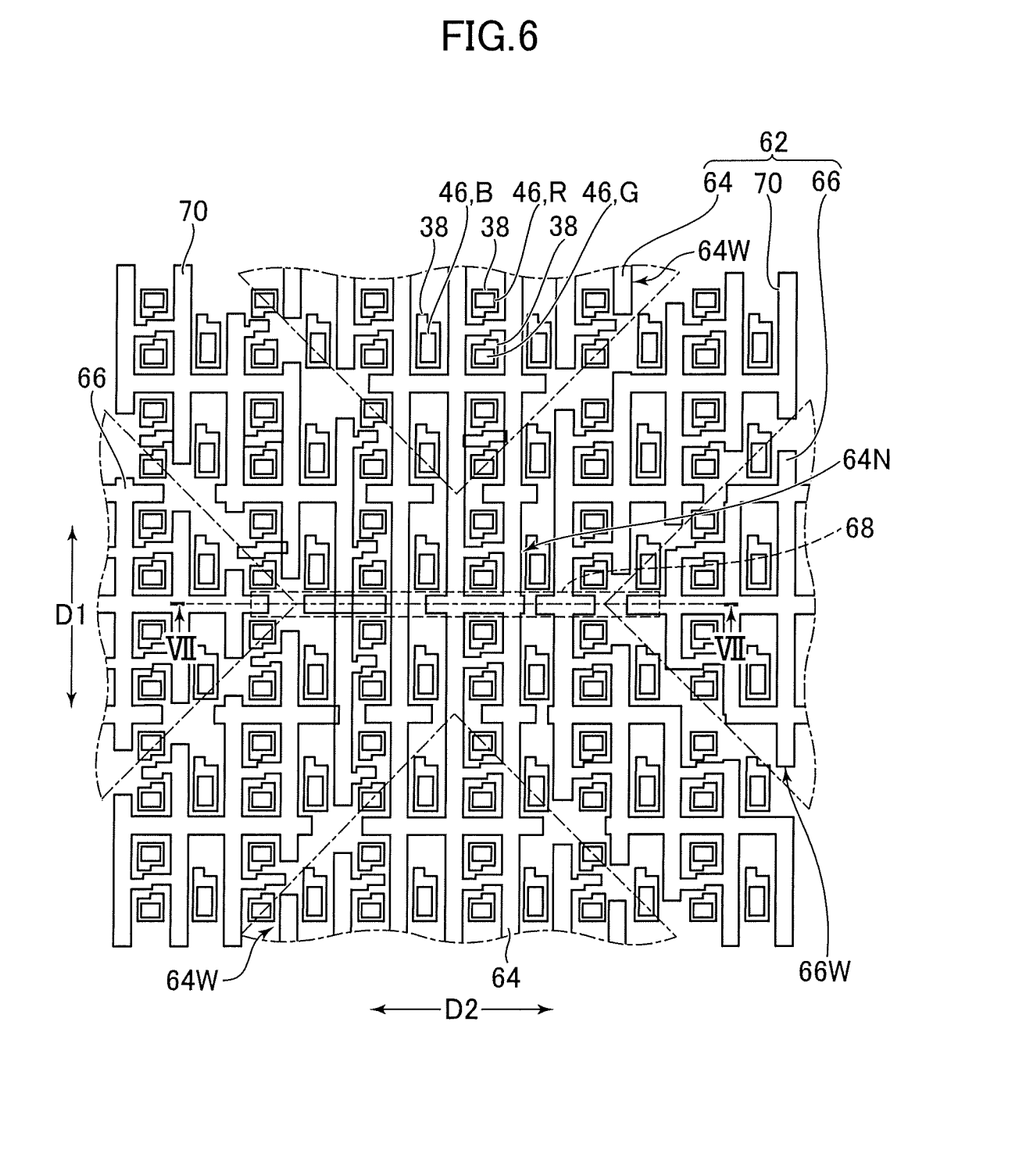
FIG. 6 is a plan view enlarging the part of the display area.

FIG. 5 is a plan view of a part of the display area. FIG. is a plan view enlarging the part of the display area DA illustrated in FIG. 1. The plurality of pixel electrodes 38 are arranged in the display area DA. The plurality of light emitting layers 46 that respectively emit light of any of the plurality of colors (for example, red R, green G, and blue B) are laminated on the plurality of pixel electrodes 38. The full-color pixel is composed of a plurality of sub-pixels of different colors.

The multifunctional electrode 62 is configured to avoid overlapping with the plurality of pixel electrodes 38. Specifically, the multifunctional electrode 62 includes a plurality of portions each passing between a pair of adjacent pixel electrodes of the plurality of pixel electrodes 38. The plurality of pixel electrodes 38 are classified into a plurality of types (different colors) corresponding to emission colors of the plurality of light emitting layers 46 located immediately above the pixel electrodes 38.

The multifunctional electrode 62 passes between sub-pixels of different colors. Specifically, a corresponding one portion of the plurality of portions constituting the multifunctional electrode 62 passes between a pair of adjacent pixel electrodes having different types (different colors) of the plurality of pixel electrodes 38. Also, the multifunctional electrode 62 passes between sub-pixels having the same color of adjacent full-color pixels. Specifically, a corresponding one portion of the plurality of portions constituting the multifunctional electrode 62 passes between a pair of adjacent pixel electrodes having the same type (same color) of the plurality of pixel electrodes 38.

As illustrated in FIG. 2, when a current flows between any of the pixel electrodes 38 and the common electrode 50, a leakage current flows through the lower common layer 44 in the direction of the light emitting layer 46 immediately above the adjacent pixel electrode 38. However, the leakage current is released to the multifunctional electrode 62 before reaching the light emitting layer 46 immediately above the adjacent pixel electrode 38. In order to make this possible, the multifunctional electrode 62 is set to a potential (for example, the same potential as the common electrode 50) closer to that of the common electrode 50 than the plurality of pixel electrodes 38 in an image display period.

In the first embodiment, the multifunctional electrode 62 is also used for mutual capacitive touch sensing. That is, at least a part of the multifunction electrode 62 functions as at least one electrode group of the transmission electrode group and the reception electrode group in a touch sensing period.

As illustrated in FIGS. 5 and 6, the multifunctional electrode 62 includes a plurality of first electrodes 64 that function as the transmission electrode group. The plurality of first electrodes 64 respectively extend in a first direction D1, and are aligned adjacent to each other in a second direction D2 intersecting the first direction D1. Each of the plurality of first electrodes 64 has a wide portion 64W and a narrow portion 64N in the second direction D2.

The multifunctional electrode 62 includes a plurality of second electrodes 66 that function as the reception electrode group. The plurality of second electrodes 66 respectively extend in the second direction D2 intermittently to avoid overlapping with the plurality of first electrodes 64, and are aligned adjacent to each other in the first direction D1.

Figure 7:
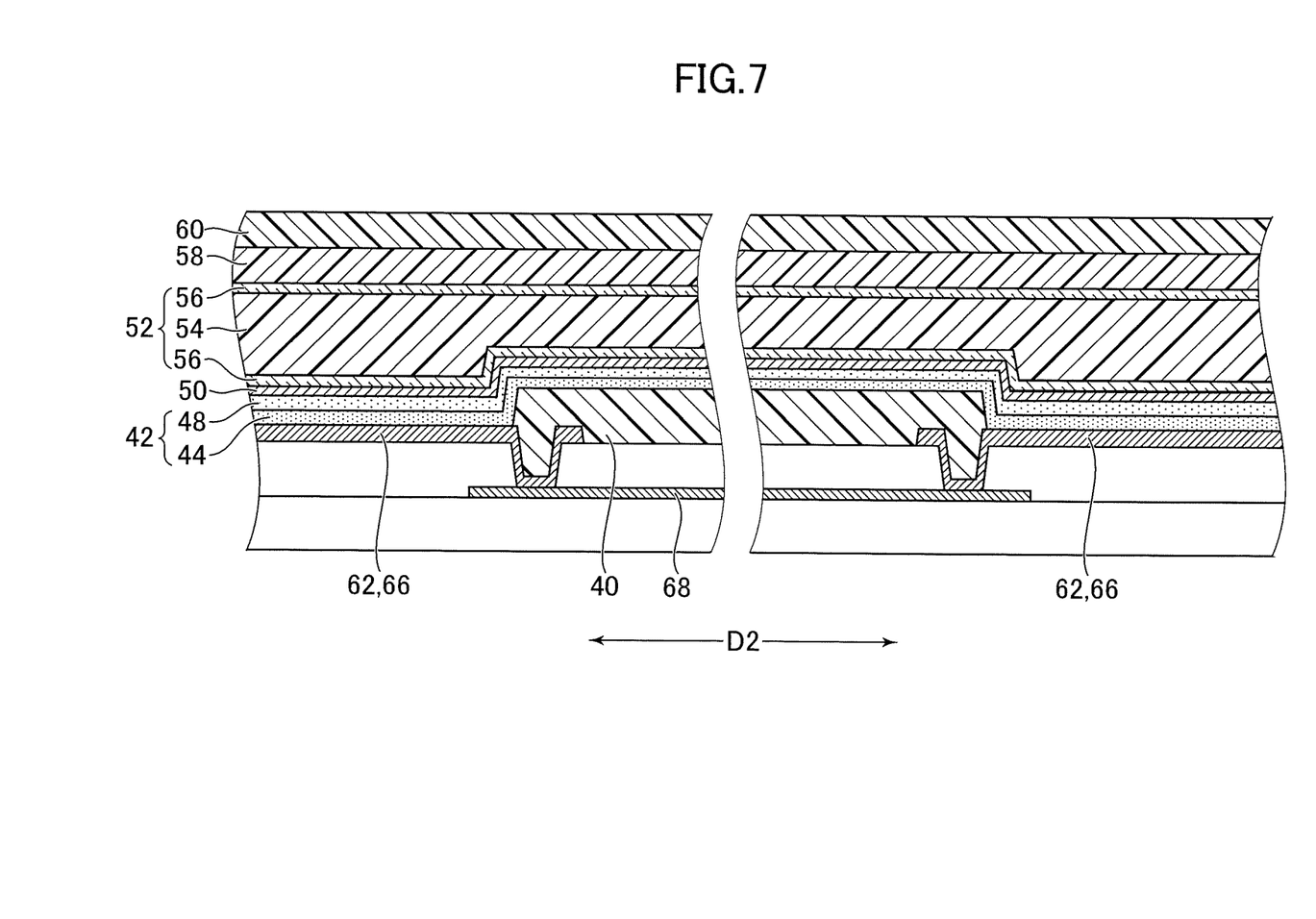
FIG. 7 is an enlarged view of a cross section taken along line VII-VII of a structure illustrated in FIG. 6.

FIG. 7 is an enlarged view of a cross section taken along line VII-VII of the structure illustrated in FIG. 6. Each of the plurality of second electrodes 66 intermittently extending in the second direction D2 is connected by a jumper wiring 68 in the second direction D2. The jumper wiring 68 is in a layer different from the multifunctional electrode 62. The jumper wiring 68 three-dimensionally intersects the narrow portion 64N of the first electrode 64 (FIG. 6). Each of the plurality of second electrodes 66 has a portion 66W wider than the jumper wiring 68 in the first direction D1 (FIG. 6).

As illustrated in FIG. 6, the multifunctional electrode 62 includes a plurality of third electrodes 70 that do not function as either the transmission electrode group or the reception electrode group. The plurality of third electrodes 70 are used to release the leakage current as described above.

Figure 8:
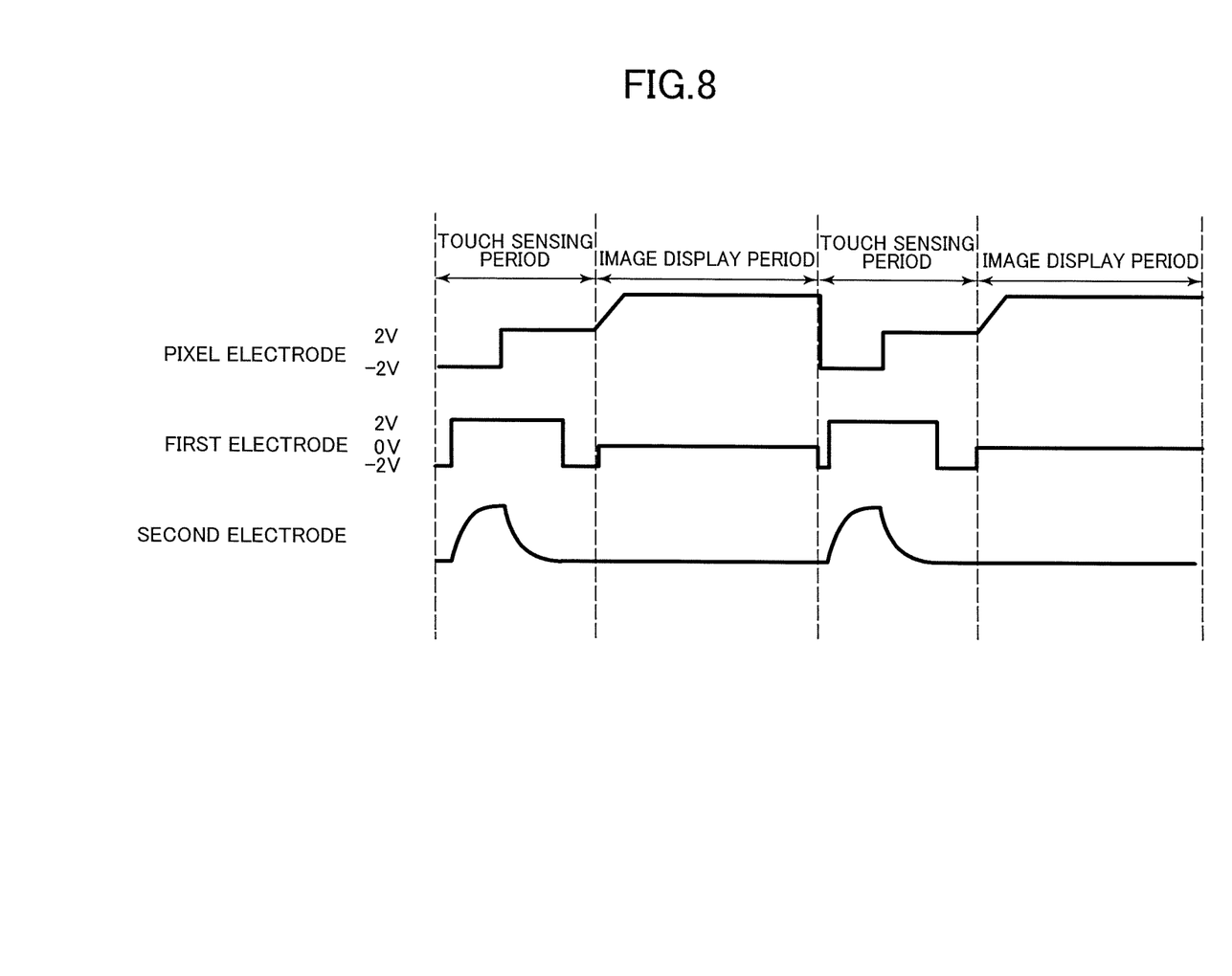
FIG. 8 is a timing diagram of an image display period and a touch sensing period.

FIG. 8 is a timing diagram of the image display period and the touch sensing period. The image display period and the touch sensing period are alternately repeated. The common electrode 50 is set to 0V throughout the image display period and the touch sensing period.

In the image display period, a voltage of 2V to 5V is applied to the pixel electrode 38, and a current corresponding to gradation flows in the light emitting layer 46. However, at 2V, the light emitting layer 46 does not emit light and displays black. In the image display period, the multifunction electrode 62 (first electrode 64, second electrode 66, and third electrode 70) illustrated in FIG. 6 is set to 0V. Accordingly, the leakage current flowing from the pixel electrode 38 to the lower common layer 44 is released from the multifunctional electrode 62.

In the touch sensing period, as illustrated in FIG. 8, a pulse signal for touch sensing is input to the first electrode 64. The pulse signal rises from −2V (L level) to 2V (H level). When the pulse signal rises, the pixel electrode 38 is at −2V which is the same as the L level. When the pulse signal falls, the pixel electrode 38 is at 2V which is the same as the H level.

The first electrode 64 and the second electrode 66 which are close to each other are capacitively coupled. When the pulse signal is input to the first electrode 64, a voltage appears at the second electrode 66 and a current flows. When the screen is touched with a finger, the current decreases, and the touch position can be detected by detecting this decrease in current.

As described above, the multifunctional electrode 62 is used not only for releasing the leakage current but also for touch sensing, and thus it can be effectively used.

Second Embodiment

Figure 9:
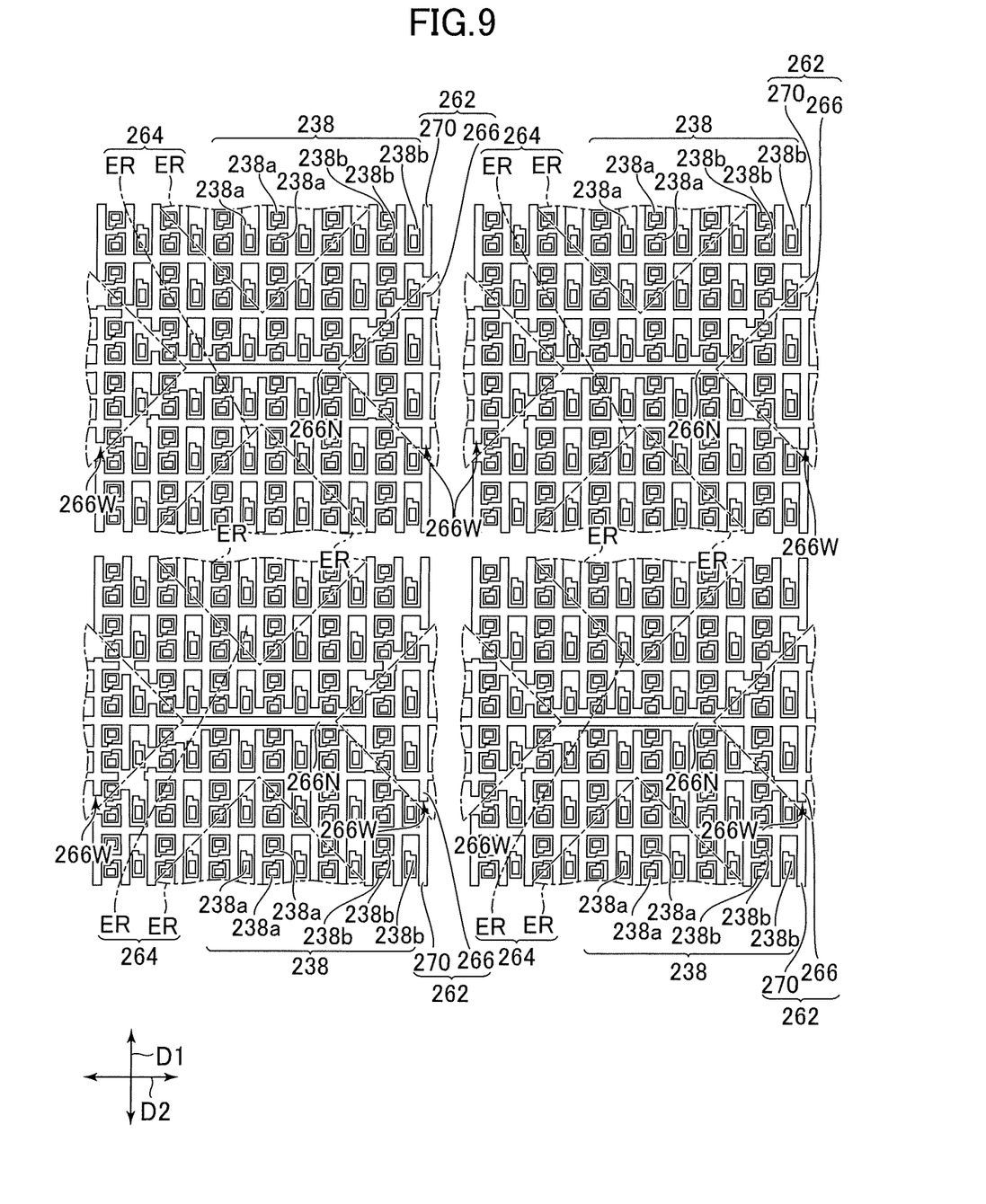
FIG. 9 is a plan view of a part of a display area in a second embodiment.
Figure 10:
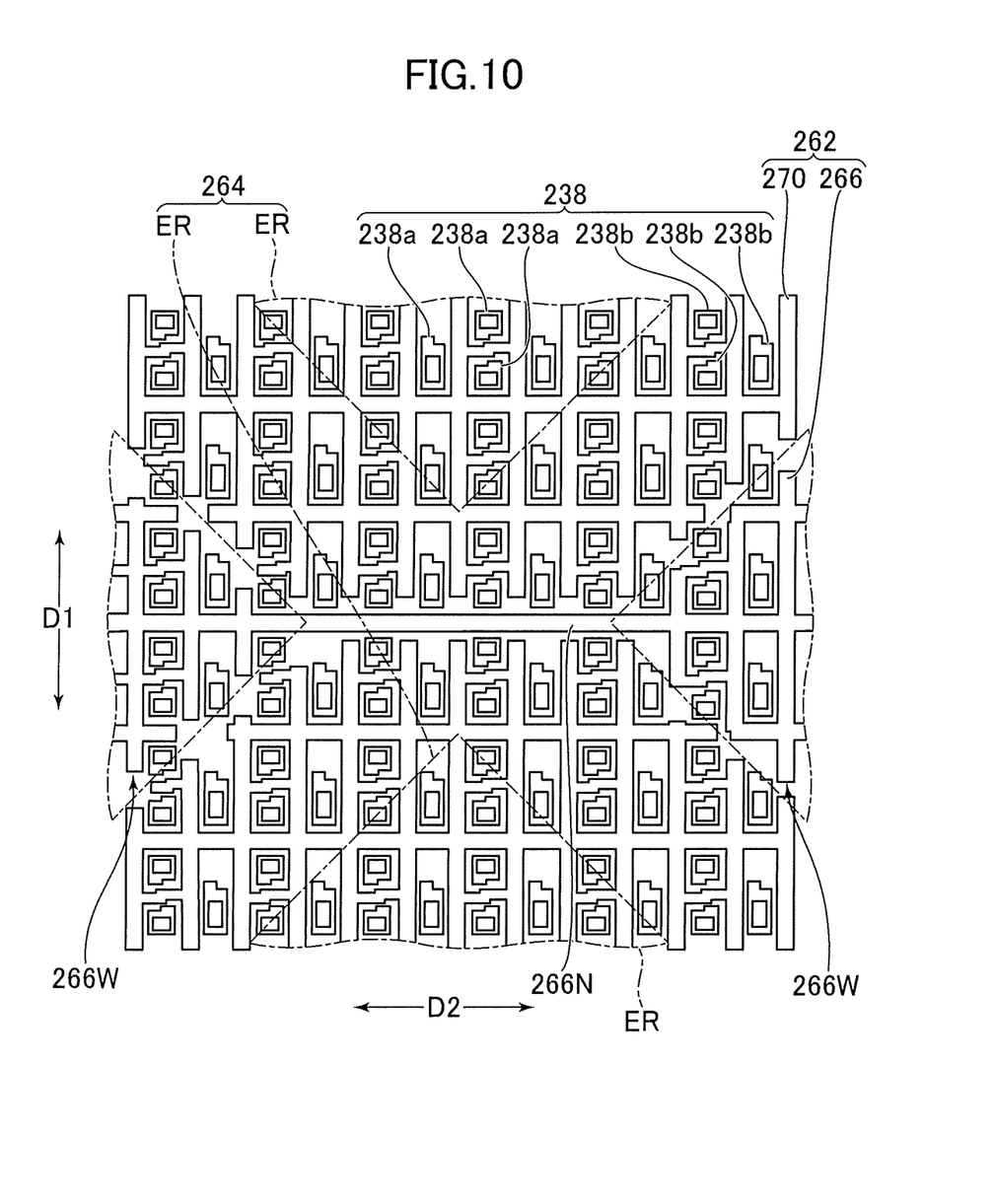
FIG. 10 is an enlarged plan view of the part of the display area in the second embodiment.

FIG. 9 is a plan view of a part of a display area in a second embodiment. FIG. 10 is a plan view enlarging the part of the display area DA in the second embodiment. For touch sensing, a plurality of first electrodes 264 function as one electrode group (for example, the transmission electrode group) of the transmission electrode group and the reception electrode group. The plurality of first electrodes 264 respectively extend in the first direction D1, and are aligned adjacent to each other in the second direction D2 intersecting the first direction D1.

The plurality of first electrodes 264 are constituted with a plurality of electrode regions ER. The plurality of electrode regions ER are arranged in a plurality of rows in the first direction D1 corresponding to the plurality of first electrodes 264. That is, several electrode regions ER aligned in the first direction D1 with a space between each other constitute one first electrode 264. In the plurality of electrode regions ER, pixel electrodes 238a included in a plurality of pixel electrodes 238 are arranged. The plurality of pixel electrodes 238 also include other pixel electrodes 238b that do not constitute any of the plurality of first electrodes 264.

A multifunction electrode 262 includes a plurality of second electrodes 266 that function as the other electrode group (for example, the reception electrode group) of the transmission electrode group and the reception electrode group. The plurality of second electrodes 266 respectively extend in the second direction D2, and are aligned adjacent to each other in the first direction D1. Each of the plurality of second electrodes 266 has a wide portion 266W and a narrow portion 266N in the first direction D1. The narrow portion 266N is between the electrode regions ER adjacent to (closest to) each other in the first direction D1. The multifunctional electrode 262 includes a plurality of third electrodes 270 that do not function as any of the transmission electrode group and the reception electrode group. The plurality of first electrodes 264 (a group of pixel electrodes 238a) and the plurality of second electrodes 266 are aligned in an intersecting direction so as to serve as transmission electrodes and reception electrodes.

Figure 11:
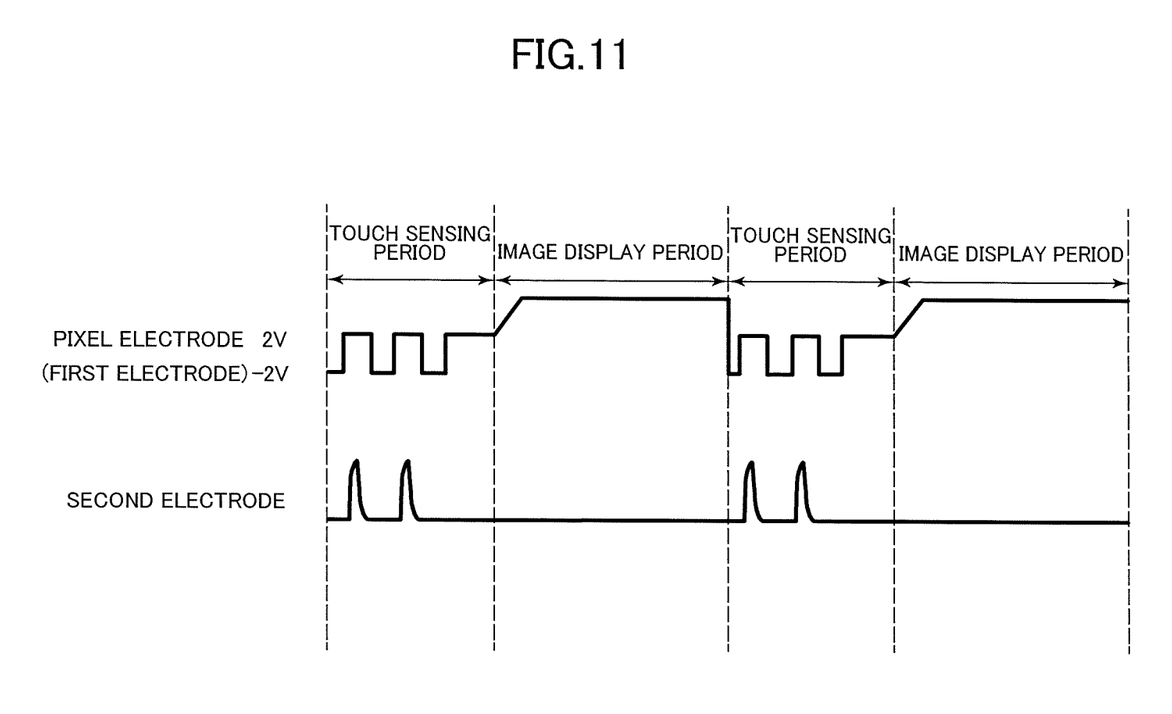
FIG. 11 is another timing diagram of the image display period and the touch sensing period.

FIG. 11 is another timing diagram of the image display period and the touch sensing period. The image display period and the touch sensing period are alternately repeated. The common electrode 50 is set to 0V throughout the image display period and the touch sensing period.

In the image display period, a voltage of 2V to 5V is applied to the pixel electrode 238, and a current corresponding to gradation flows in the light emitting layer 46. However, at 2V, the light emitting layer 46 does not emit light. In the image display period, the multifunction electrode 262 (second electrode 266 and third electrode 270) is set to 0V. Accordingly, the leakage current flowing from the pixel electrode 238 to the lower common layer 44 is released from the multifunctional electrode 262.

In the touch sensing period, a pulse signal for touch sensing is input to the first electrode 264 (pixel electrode 238a). The pulse signal rises from −2V (L level) to 2V (H level).

The first electrode 264 (pixel electrode 238a) and the second electrode 266 (multifunctional electrode 262), which are close to each other are capacitively coupled. When the pulse signal is input to the first electrode 264, a voltage appears at the second electrode 266 and a current flows. When the screen is touched with a finger, the current decreases, and the touch position can be detected by detecting this decrease in current. As described above, in this embodiment, the multifunctional electrode 262 is used not only for releasing the leakage current but also for touch sensing, and can be effectively used.

While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
   a plurality of pixel electrodes;
   a multifunctional electrode;
   an electroluminescent layer laminated on the plurality of pixel electrodes and the multifunctional electrode; and
   a common electrode laminated on the electroluminescent layer, wherein
   the electroluminescent layer includes a lower common layer that continuously overlaps and contacts the plurality of pixel electrodes and the multifunctional electrode and a plurality of light emitting layers separated from each other corresponding to each of the plurality of pixel electrodes on the lower common layer, the multifunctional electrode includes a plurality of portions each passing between a pair of adjacent pixel electrodes of the plurality of pixel electrodes, and is set to a potential closer to that of the common electrode than the plurality of pixel electrodes in an image display period, and at least a part of the multifunctional electrode functions as at least one electrode group of a transmission electrode group and a reception electrode group in a touch sensing period.

2. The display device according to claim 1, wherein the multifunctional electrode is in the same layer as the plurality of pixel electrodes.

3. The display device according to claim 1, wherein the multifunctional electrode includes a plurality of first electrodes functioning as one electrode group of the transmission electrode group and the reception electrode group and a plurality of second electrodes functioning as the other electrode group of the transmission electrode group and the reception electrode group.

4. The display device according to claim 3, wherein the plurality of first electrodes respectively extend in a first direction and are aligned adjacent to each other in a second direction intersecting the first direction, the plurality of second electrodes respectively extend in the second direction intermittently to avoid overlapping with the plurality of first electrodes and are aligned adjacent to each other in the first direction, and the display device further comprises a jumper wiring that is in a different layer from the multifunctional electrode and connects each of the plurality of second electrodes intermittently placed in the second direction in the second direction.

5. The display device according to claim 1, wherein each of the plurality of first electrodes has a wide portion and a narrow portion in the second direction, and the jumper wiring three-dimensionally intersects the narrow portion.

6. The display device according to claim 5, wherein each of the plurality of second electrodes has a portion wider than the jumper wiring in the first direction.

7. The display device according to claim 1, wherein pixel electrode groups included in the plurality of pixel electrodes are arranged in a plurality of electrode regions in order to constitute a plurality of first electrodes functioning as one electrode group of the transmission electrode group and the reception electrode group, and the multifunctional electrode includes a plurality of second electrodes functioning as the other electrode group of the transmission electrode group and the reception electrode group.

8. The display device according to claim 7, wherein the plurality of first electrodes respectively extend in a first direction and are aligned adjacent to each other in a second direction intersecting the first direction, the plurality of electrode regions are arranged in a plurality of rows in the first direction corresponding to the plurality of first electrodes, and the plurality of second electrodes respectively extend in the second direction and are aligned adjacent to each other in the first direction.

9. The display device according to claim 8, wherein each of the plurality of second electrodes has a wide portion and a narrow portion in the first direction, and the narrow portion is between the electrode regions adjacent in the first direction.

10. The display device according to claim 7, wherein the plurality of pixel electrodes include other pixel electrode groups that do not constitute any of the plurality of first electrodes.

11. The display device according to claim 1, wherein the multifunctional electrode includes an electrode group which does not function as either the transmission electrode group or the reception electrode group.

12. The display device according to claim 1, wherein the plurality of pixel electrodes are classified into a plurality of types corresponding to emission colors of the plurality of light emitting layers, and a corresponding one portion of the plurality of portions constituting the multifunctional electrode passes between a pair of adjacent pixel electrodes having different types of the plurality of pixel electrodes.

13. The display device according to claim 12, wherein a corresponding one portion of the plurality of portions constituting the multifunctional electrode passes between a pair of adjacent pixel electrodes having the same type of the plurality of pixel electrodes.

14. The display device according to claim 1, wherein the image display period and the touch sensing period are alternately repeated.

15. The display device according to claim 1, wherein the multifunctional electrode is set to the same potential as that of the common electrode in the image display period.

* * * * *